(12) United States Patent
Towne et al.

(10) Patent No.: US 9,523,742 B2
(45) Date of Patent: Dec. 20, 2016

(54) CIRCUITS AND METHODS FOR MODULATING CURRENT IN CIRCUITS COMPRISING SENSING ELEMENTS

(71) Applicant: ALLEGRO MICROSYSTEMS, LLC, Worcester, MA (US)

(72) Inventors: Jay M. Towne, Bow, NH (US); P. Karl Scheller, Bow, NH (US); Eric G. Shoemaker, Windham, NH (US)

(73) Assignee: Allegro MicroSystems, LLC, Worcester, MA (US)

( * ) Notice: Subject to any disclaimer, the term of this patent is extended or adjusted under 35 U.S.C. 154(b) by 24 days.

(21) Appl. No.: 14/696,674

(22) Filed: Apr. 27, 2015

(65) Prior Publication Data

US 2016/0313407 A1 Oct. 27, 2016

(51) Int. Cl.
| | |
|---|---|
| *G01R 33/06* | (2006.01) |
| *G01R 33/07* | (2006.01) |
| *G01R 33/09* | (2006.01) |
| *G01R 33/00* | (2006.01) |
| *H03F 1/02* | (2006.01) |
| *H03G 1/00* | (2006.01) |
| *G01D 5/14* | (2006.01) |

(52) U.S. Cl.
CPC ............ *G01R 33/0041* (2013.01); *G01D 5/145* (2013.01); *G01R 33/0029* (2013.01); *G01R 33/07* (2013.01); *G01R 33/09* (2013.01); *H03F 1/0216* (2013.01); *H03G 1/0035* (2013.01)

(58) Field of Classification Search
CPC ...... G01D 5/145; G01D 5/2448; G01R 33/07; G01R 33/09

USPC .......................................... 324/225, 251, 252
See application file for complete search history.

(56) References Cited

U.S. PATENT DOCUMENTS

| | | | |
|---|---|---|---|
| 5,218,298 A | * | 6/1993 | Vig ........................ G01R 33/07 324/207.2 |
| 5,619,137 A | | 4/1997 | Vig et al. |
| 5,621,319 A | | 4/1997 | Bilotto et al. |
| 5,694,038 A | | 12/1997 | Moody et al. |
| 6,100,680 A | | 8/2000 | Vig et al. |
| 6,232,768 B1 | | 5/2001 | Moody et al. |
| 6,297,627 B1 | | 10/2001 | Towne et al. |
| 7,425,821 B2 | | 9/2008 | Monreal et al. |

(Continued)

OTHER PUBLICATIONS

U.S. Appl. No. 14/681,575; 37 pages.
Search Report and Written Opinion dated Jul. 21, 2016 for PCT Application No. PCT/US2016/027486; 17 pages.

*Primary Examiner* — Reena Aurora
(74) *Attorney, Agent, or Firm* — Daly, Crowley, Mofford & Durkee, LLP

(57) ABSTRACT

A circuit includes a current source having at least first terminal and a second, control terminal. The current source is configured to receive a current control signal at the control terminal and in response thereto generates a first current signal at the first terminal. The current control signal controls a current level of the first current signal. The circuit also includes at least one sensing element responsive to one or more sense parameters and having an input adapted to couple to the first terminal of said current source. The sensing element is configured to receive one or more current signals comprising at least the first current signal and in response thereto generates a sensed output signal at an output thereof. A corresponding method for operating the circuit is also provided.

20 Claims, 7 Drawing Sheets

(56) References Cited

U.S. PATENT DOCUMENTS

| | | |
|---|---|---|
| 7,605,647 B1 | 10/2009 | Romero et al. |
| 7,619,406 B2 * | 11/2009 | Voisine .................. G01D 5/247 324/207.25 |
| 7,973,527 B2 | 7/2011 | Taylor et al. |
| 8,350,563 B2 | 1/2013 | Haas et al. |
| 8,564,285 B2 | 10/2013 | Romero et al. |
| 8,680,848 B2 | 3/2014 | Foletto et al. |
| 2007/0247141 A1 | 10/2007 | Pastre et al. |
| 2009/0212765 A1 | 8/2009 | Doogue et al. |
| 2012/0249126 A1 | 10/2012 | Friedrich et al. |
| 2013/0093412 A1 | 4/2013 | Anelli et al. |
| 2013/0320941 A1 | 12/2013 | Contaldo et al. |

\* cited by examiner

CIRCUITS AND METHODS FOR MODULATING CURRENT IN CIRCUITS COMPRISING SENSING ELEMENTS

CROSS REFERENCE TO RELATED APPLICATIONS

None.

GOVERNMENT RIGHTS

None.

FIELD

This disclosure relates generally to sensing circuits, and, more particularly, to circuits and related techniques for modulating current in circuits comprising sensing elements.

BACKGROUND

As is known, sensing elements are used in a variety of applications. Sensing elements include, but are not limited to, pressure sensing elements, temperature sensing elements, light sensing elements, acoustic sensing elements and magnetic field sensing elements. Magnetic field sensors, for example, are circuits generally including one or more magnetic field sensing elements, generally in combination with other circuits. In one application, a magnetic field sensor can be used to detect a direction of a magnetic field. In another application, a magnetic field sensor can be used to sense an electrical current. One such magnetic field sensor is described in U.S. Pat. No. 8,350,563 entitled "Magnetic Field Sensor and Method used in a Magnetic Field Sensor that Adjusts a Sensitivity and/or Offset over Temperature," which is assigned to the assignee of the present disclosure and is incorporated herein by reference in its entirety.

Various parameters characterize the performance of magnetic field sensors and their magnetic field sensing elements. These parameters can include sensitivity, which is a change in an output signal of a magnetic field sensing element in response to a change of magnetic field experienced by the magnetic field sensing element, and linearity, which is a measure of how a magnetic field sensing element output signal varies in direct proportion to a magnetic field. Another parameter used to characterize a magnetic field sensor is an offset value (or more simply "offset"). Offset is a measure of how far removed from zero a magnetic field sensing element output signal is when the magnetic field sensing element experiences a zero magnetic field.

While it is desirable to limit an amount of current flowing into magnetic field sensors and similar circuits (e.g., for power usage considerations), a competing requirement is that magnetic field sensor performance (e.g., signal-to-noise ratio (SNR)) tends to improve when providing magnetic field sensing elements with more current. Magnetic field sensing elements tend to have sensitivities to magnetic fields (i.e., output voltages per Gauss) directly related to a magnitude of a current with which they are powered or driven. Additionally, an improved (or higher) SNR typically provides better performance on magnetic field sensor specifications that require consistent switching locations, including jitter (also sometimes referred to as repeatability).

SUMMARY

The present disclosure describes circuits and techniques for modulating current in circuits comprising sensing elements. The described circuitry and methods can be used to provide a circuit having an increased signal-to-noise ratio (SNR) in comparison to conventional circuits while also limiting the amount of current flowing into the circuit.

In one aspect of the concepts described herein, a circuit includes a current source configured to receive a control signal (sometimes referred to herein as a "current control signal" since the control signal controls a current signal provided by the current source) at a control terminal thereof. In response to the control signal, the current source generates a first current signal at a first terminal thereof. The control signal controls a current level of the first current signal. The circuit also includes at least one sensing element responsive to one or more sense parameters having an input adapted to couple to the first terminal of the current source. The sensing element is configured to receive one or more current signals comprising at least the first current signal at the input thereof and in response thereto generate a sensed output signal at an output thereof.

The circuit additionally includes a gain adjustable circuit having at least an input terminal, a control terminal, and an output terminal. The gain adjustable circuit is configured to receive a signal representative of the sensed output signal at the input terminal, a gain control signal at the control terminal, and in response thereto provide a gain adjusted signal (including negative gain) having an associated gain level at an output thereof. The gain control signal controls gain of the gain adjustable circuit.

The circuit is provided having one or more corresponding points, referred to herein as "switchpoints," at which a characteristic of an output of the circuit transitions from one state or value to another in response to one or more of the sense parameters being greater than or less than a threshold value (or a threshold signal). A current level of the current signals received by the sensing element is configured to be increased from a first current level to a second, higher current level of a plurality of current levels and the gain of the gain adjustable circuit is configured to be decreased from a second gain level to a first, lower gain level of a plurality of gain levels when the output of the circuit is operating at or near a first switchpoint corresponding to one or more of the sense parameters being greater than the threshold value (or signal). In one aspect, the gain level of the gain adjusted signal remains substantially constant (e.g., regardless of whether the output of the circuit is operating at or near the first switchpoint).

The circuit may include one or more of the following features individually or in combination with other features. The current level of the current signals received by the sensing element may be configured to be decreased from the second, higher current level to the first current level of the plurality of current levels and the gain of the gain adjustable circuit may be configured to be increased from the first, lower gain level to the second gain level of the plurality of gain levels when the output of the circuit is not operating at or near the first switchpoint. The current level of the current signals received by the sensing element may be configured to be increased from the first current level to the second, higher current level of the plurality of current levels and the gain of the gain adjustable circuit may be configured to be decreased from the second gain level to the first, lower gain level of the plurality of gain levels when the output of the circuit is operating at or near a second switchpoint that is substantially the same as the first switchpoint but of a substantially opposite polarity.

The circuit may also include one or more of the following features individual or in combination with other features.

The sense parameters may comprise a measured magnetic field. The circuit may further include a current modulation circuit having a first terminal adapted to couple to the sensing element input and a second, control terminal. The current modulation circuit may be configured to receive a current modulation control signal at the control terminal and in response thereto generate a second current signal at the first terminal. The current modulation control signal may control a current level of the second current signal and the second current signal may be capable of increasing the current level of the current signals received by the sensing element from the first current level to the second, higher current level of the plurality of current levels. The controller may provide the current modulation control signal to the control terminal of the current modulation circuit.

The circuit may additionally include one or more of the following features individually or in combination with other features. The circuit may further include an amplifier having an input adapted to couple to the sensing element output and an output adapted to couple to the input terminal of the gain adjustable circuit input. The amplifier may be configured to receive the sensed output signal at the input thereof and in response thereto generate an amplified signal at the output thereof. The amplifier may be provided having a lower noise characteristic than the gain adjustable circuit. The amplifier may have a current control terminal and the current source may provide an amplifier current control signal to the current control terminal of the amplifier. The amplifier current control signal may control a current level of current signals received by the amplifier. The amplifier may have a gain control terminal and the controller may provide a gain control signal to the gain control terminal of the amplifier. The gain control signal may control a gain level of the amplified signal.

The circuit may further include one or more of the following features individually or in combination with other features. The circuit may further comprise a voltage source adapted to couple to the sensing element input. The current level of the current signals received by the sensing element may be further configured to decrease from the first current level to the second, lower current level of the plurality of current levels in response to a decrease in a voltage level of the voltage source or a reduction in the available headroom of the voltage source from a first voltage level to a second, lower voltage level of a plurality of voltage levels. A signal-to-noise ratio (SNR) of the output of the circuit may be increased from a first value to a second, higher value when the output of the circuit is operating at or near the first switchpoint. The gain adjustable circuit may be provided as a variable resistor divider. The circuit may be a magnetic field sensor. The sensing element may comprise a Hall effect element. The sensing element may comprise a magnetoresistance element. The magnetoresistance element may be one of: an anisotropic magnetoresistance (AMR) element, a giant magnetoresistance (GMR) element, a tunneling magnetoresistance (TMR) element, a magnetic tunnel junction (MTJ) element, or a spin valve element.

In another aspect of the concepts described herein, a method for modulating current in a circuit comprising at least one sensing element responsive to one or more sense parameters, where the circuit is provided having one or more switchpoints at which a characteristic of the output of the circuit transitions in response to one or more of the sense parameters being greater than or less than a threshold value, includes receiving one or more current signals comprising at least a first current signal at an input of the sensing element. The method additionally includes generating a sensed output signal at an output of the sensing element in response to the current signals.

The method further includes receiving a signal representative of the sensed output signal at first, input terminal of a gain adjustable circuit and a gain control signal at a second, control terminal of the gain adjustable circuit. The gain control signal controls gain of the gain adjustable circuit. The method also includes providing a gain adjusted signal having an associated gain level at third, output terminal of the gain adjustable circuit in response to the signal representative of the sensed output signal and the gain control signal. The method additionally includes adjusting a current level of the current signals according to an output of the circuit. In response to the output of the circuit operating at or near a first switchpoint corresponding to one or more of the sense parameters being greater than the threshold value, the current level is configured to be increased from a first current level to a second, higher current level of a plurality of current levels.

The method also includes adjusting gain of the gain adjustable circuit according to the output of the circuit. In response to the output of the circuit operating at or near the first switchpoint, the gain of the gain adjustable circuit is configured to be decreased from a second gain level to a first, lower gain level of a plurality of gain levels. In one aspect, the gain level of the gain adjusted signal generated by the gain adjustable circuit remains substantially constant (e.g., whether or not the sensing element is operating at or near the first switchpoint).

The method may include one or more of the following features either individually or in combination with other features. The current level of the current signals may be adjusted by adjusting the current level of the first current signal according to the output of the circuit. The current level of the current signals may be adjusted by adjusting the current level of the current signals according to the output of the circuit, where the current level of the current signals is configured to be decreased from the second, higher current level to the first current level when the output of the circuit is not operating at or near the first switchpoint.

The current level of the current signals may be adjusted by coupling a current modulation circuit to the sensing element, the current modulation circuit having a first terminal adapted to couple to the sensing element input and a second, control terminal. A control signal (also sometimes referred to herein as a "current modulation control signal") may be generated for coupling to the control terminal of the current modulation circuit. A second current signal may be generated at the first terminal of the current modulation circuit in response to the control signal (e.g., current modulation control signal). The control signal may control a current level of the second current signal. The current level of the current signals may be adjusted according to the output of the circuit by adjusting the current level of the second current signal.

BRIEF DESCRIPTION OF THE DRAWINGS

Features and advantages of the concepts, systems and techniques disclosed herein will be apparent from the following description of the embodiments taken in conjunction with the accompanying drawings in which.

DETAILED DESCRIPTION

Figure 1:
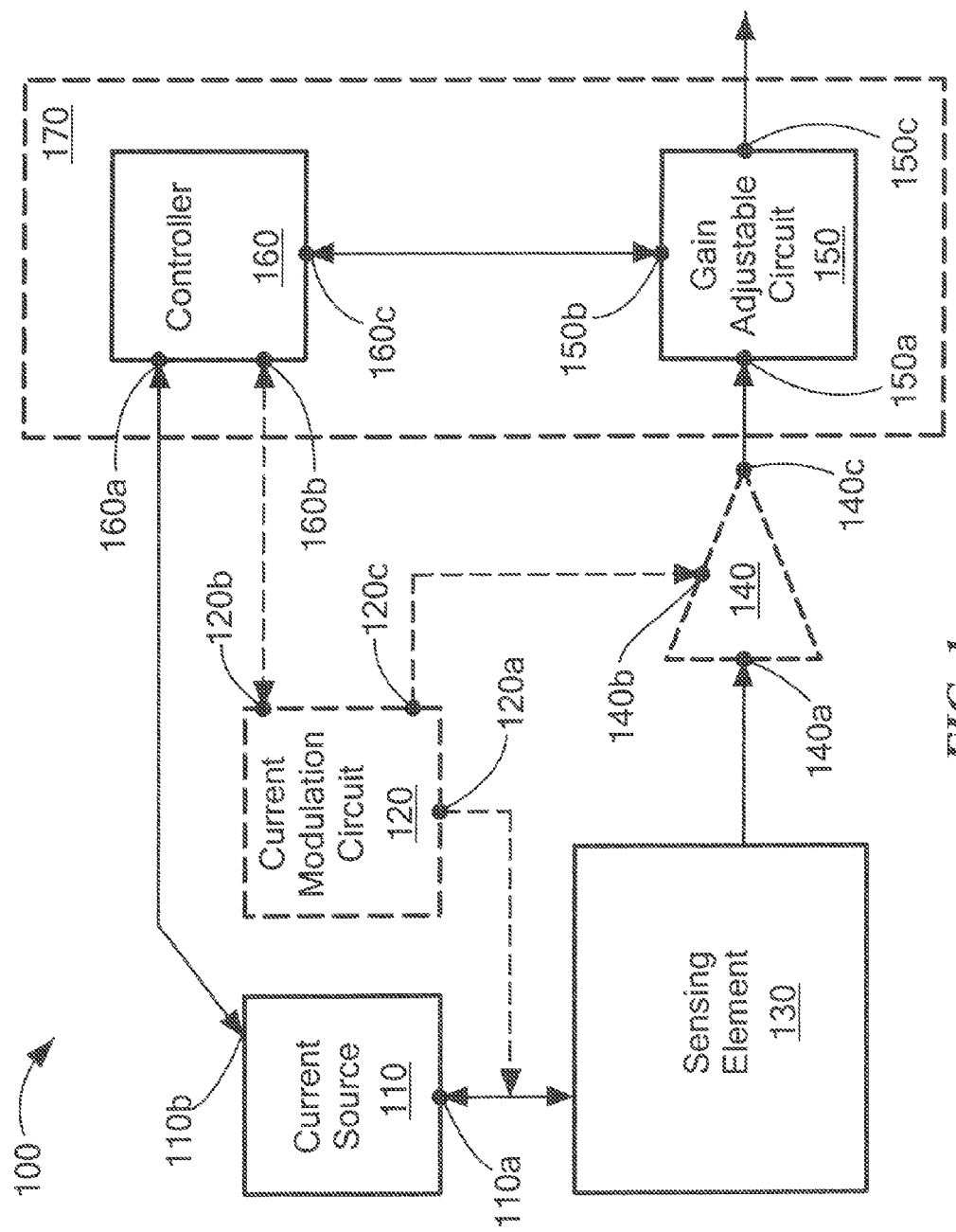
FIG. 1 is a block diagram of an example circuit including a current source, at least one sensing element, a gain adjustable circuit, a controller and an optional current modulation circuit.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views.

For convenience, certain introductory concepts and terms used in the specification are collected here.

As used herein, the term "sensor" is used to describe a circuit or assembly that includes a sensing element and other components. The term "magnetic field sensor" is used to describe a circuit generally including one or more magnetic field sensing elements, generally in combination with other circuits. Magnetic field sensors are used in a variety of applications, including, but not limited to, an angle sensor that senses an angle of a direction of a magnetic field, a current sensor that senses a magnetic field generated by a current carded by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "sensing element" is used to describe any element capable of detecting a quantity (e.g., such as pressure, temperature, light, sound) and/or the presence of and/or a characteristic of an electric, magnetic, electromagnetic or other signal.

One type of sensing element is a magnetic field sensing element. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit or digital circuit. The "controller" described herein may be provided as a "processor."

While circuits including magnetic field sensing elements are described in examples below, the same or similar concepts and techniques described herein can be applied to other types of circuits (e.g., transducers) including substantially any type of sensing element, including sensing elements that sense signals other than magnetic fields and sensing elements which are arranged in series or in parallel with other sensing elements (e.g., to reduce thermal noise in the circuit). The same or similar techniques are particularly suitable for circuits including sensing elements for which signal-to-noise ratio (SNR) is typically improved (or voltage sensitivity is improved or maintained) by having more current in the sensing element while a competing requirement is it is also desirable to limit the amount of current flowing into the circuit comprising the sensing element for power usage considerations, for example.

Also, while circuits including a single sensing element are described in several examples below, a single sensing element is discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using more than a single sensing element.

Further, while current sources are described as generating current signals having first and second current levels and voltage sources are described as generating voltage signals having first and second voltage levels in several examples below, the foregoing is also discussed to promote simplicity, clarity and understanding in the description of the concepts, systems, circuits and techniques sought to be protected herein and is not intended to be, and should not be construed, as limiting. The current sources and voltage sources disclosed herein may, of course, be implemented to generate current signals and voltages signals having more than first and second current levels and first and second voltage levels, respectively.

Referring now to FIG. 1, an example circuit 100 in accordance with the concepts, systems, circuits and techniques sought to be protected herein includes a current source 110 adapted to couple to an input of at least one sensing element 130 (e.g., a magnetic field sensing element), which is responsive to one or more sense parameters (e.g., a measured magnetic field). The circuit 100 which may, for example, be provided as a magnetic field sensor and implemented in the form of an integrated circuit, also includes a signal path (e.g., an analog, digital or mixed signal path) comprising an amplifier 140 (e.g., a "pre-amplifier") and a gain adjustable circuit 150 (e.g., an amplifier with an adjustable gain) coupled to an output of the sensing element 130 as shown. In this example embodiment, circuit 100 also includes a current modulation circuit 120 adapted to couple to a sensing element input and control circuitry 170 (e.g., gain and current control circuitry) including a controller 160 adapted to couple to corresponding control terminals of current source 110, current source 120 and gain adjustable circuit 150. Current modulation circuit 120 and amplifier 140 are optional in some embodiments and are thus shown in phantom in FIG. 1.

In this example embodiment, the signal path (e.g., amplifier 140, gain adjustable circuit 150) is shown as separate from the controller 160. It should, of course, be appreciated that in other embodiments one or more portions of the signal path may be provided as part of the controller 160 and, thus, control circuitry 170. The controller 160 may, for example, be configured to perform the function, operation or sequence of operations of one or more portions of the signal path.

Current source 110 has a first terminal 110a adapted to couple to a corresponding input of the sensing element 130 and a second, control terminal 110b configured to receive a control signal (e.g., from the controller 160, as will be discussed). In response to a current source control signal provided thereto, the current source 110 generates a first current signal at the first terminal 110a of current source 110. The current source control signal controls a current level of the first current signal and, in some embodiments, controls a current level of current signals received by the sensing element 130.

Current modulation circuit 120 similarly has a first terminal 120a adapted to couple to a sensing element input and a second, control terminal 120b configured to receive a control signal (e.g., also from the controller 160, as will be discussed). Additionally, current modulation circuit 120 optionally has a third terminal 120c coupled to a control terminal 140b of amplifier 140. In response to a current modulation control signal provided thereto, the current modulation circuit 120 generates a second current signal at the first terminal 120a of current modulation circuit 120 and, optionally, an amplifier current control signal at the third terminal 120c of current modulation circuit 120. The current modulation control signal controls a current level of the second current signal and, in some embodiments, controls a current level of the current signals received by the sensing element 130. Additionally, the current modulation control signal optionally controls a current level of current signals received by amplifier 140 (e.g., via the amplifier current control signal). Although current source 110 and current modulation circuit 120 are shown as separate in FIG. 1, it should, of course, be appreciated that in some embodiments the functionality provided by each of the current source 110 and the current modulation circuit 120 may be shared or split other than as illustrated in FIG. 1.

Sensing element 130, which is driven by at least one of the current source 110 and the current modulation circuit 120, receives one or more current signals comprising at least the first current signal (and, in some embodiments the second current signal) at an input thereof. In response to the current signal(s) provided thereto and the sensing element 130 sensing one or more sense parameters (e.g., a sensed magnetic field), sensing element 130 generates a sensed output signal at an output thereof.

The sensed output signal may, for example, be an electrical signal representative of one or more of the sense parameters. In some embodiments, sensing element 130 generates the sensed output signal when one or more of the sense parameters are greater than a predetermined value (e.g., a predetermined magnetic flux value).

The output of sensing element 130 is coupled to an input terminal 140a of amplifier 140 in the example embodiment shown. Additionally, an output terminal 140c of amplifier 140 is coupled to an input terminal 150a of gain adjustable circuit 150 and an output terminal 150c of gain adjustable circuit 150 is coupled to an output of circuit 100 in the example embodiment shown. Thus, the output of sensing element 130 is coupled to an output of circuit 100 via the signal path (including the amplifier 140 and the gain adjustable circuit 150).

The amplifier 140, which may be provided as a "low-noise" pre-amplifier (LNP) circuit (e.g., having a lower noise characteristic than the gain adjustable circuit 150), receives the sensed output signal at the input thereof (i.e., input terminal 140a) and in response thereto generates an amplified signal at an output thereof (i.e., output terminal 140c). In embodiments where amplifier 140 has a control terminal 140b and amplifier 140 is configured to receive an amplifier current control signal from current modulation circuit 120 at the control terminal 140b, a current level of current signals received by amplifier 140 may be controlled (i.e., increased, decreased, or maintained) by current modulation circuit 120 (e.g., to modulate the amplified signal generated at the output of amplifier 140, to lower Schottky (or "shot") noise of circuit 100, and/or further improve the signal-to-noise ratio (SNR) of circuit 100).

The gain adjustable circuit 150, which may include automatic gain control (AGC) circuitry and may be provided as or include a variable resistor divider (e.g., as may be provided from a potentiometer or the like) in some embodiments, has a control terminal 150b adapted to couple to a third terminal 160c of the controller 160. Circuits including automatic gain control (AGC) circuitry are described in U.S. Pat. No. 6,297,627 entitled "Detection of passing magnetic articles with a peak-to-peak percentage threshold detector having a forcing circuit and automatic gain control," and in U.S. Pat. No. 8,350,563, as referenced in the Background section above, both of which are assigned to the assignee of the present disclosure and incorporated herein by reference.

The gain adjustable circuit 150 receives a signal representative of the sensed output signal (i.e., the amplified signal in the example embodiment shown) at the input thereof (i.e., input terminal 150a). In response to the signal provided thereto and a gain control signal received at the control terminal 150b of the gain adjustable circuit 150b (e.g., from the controller 160, as will be discussed), the gain adjustable circuit 150 provides a gain adjusted signal having an associated gain level (e.g., of a plurality of potential gain levels) at an output thereof (i.e., output terminal 150c). The gain adjustable circuit 150 may, for example, attenuate the amplified signal received from amplifier 140 to produce the gain adjusted signal. In embodiments where the gain adjustable circuit 150 is provided as a variable resistor divider, a voltage associated with the variable resistor divider may provide the gain adjusted signal.

In one embodiment, the gain level of the gain adjusted signal remains substantially constant whether or not the output of circuit 100 is operating at or near a switchpoint (e.g., points at which a characteristic of an output of the circuit transitions in response to one or more of the sense parameters being greater than or less than a threshold value or a threshold signal). The output of the circuit may, for example, take the form of an output signal and the transition may be an edge transition of the output signal. Additionally, the threshold value (or threshold signal in some embodiments) can be either static or dynamic and can be provided in a variety of manners, such as those described in co-pending U.S. patent application Ser. No. 14/600,826 entitled "Methods and Apparatus for Generating a Threshold Signal in a Magnetic Field Sensor," which is assigned to the assignee of the present disclosure and incorporated herein by reference in its entirety. As one example, the threshold value (or threshold signal) may be provided as a predetermined percentage of a peak-to-peak value of positive and negative peaks of the sensed output signal (e.g., as may be found in a peak-to-peak signal).

The gain adjusted signal is received at an output of the circuit 100 (i.e., output terminal 150c of gain adjustable circuit 150 in the example embodiment shown) and may be received by additional circuitry (e.g., signal processing circuitry) coupled to the output of the circuit 100. In embodiments where the circuit 100 is provided as part of a rotation detector circuit, for example, the gain adjusted signal may contain information such as an absolute angle of rotation of a target object (e.g., a ferromagnetic gear) sensed by the sensing element 130 as the target object rotates, a speed of rotation of the target object, and a direction of rotation of the target object (e.g., in embodiments where the circuit 100 includes two or more sensing elements 130). One such rotation detector circuit is described in U.S. Pat. No. 8,624,588 entitled "Apparatus and Method for Providing an Output Signal Indicative of a Speed of Rotation and a Direction of Rotation of a Ferromagnetic Object" and assigned to the assignee of the present disclosure.

Additionally, the gain adjusted signal may contain features (e.g., edges when the gain adjusted signal is a digital signal) coinciding with a quantity, presence and/or characteristic of locations (i.e., switchpoints) on a target object (e.g., a ferromagnetic gear). The locations on the target object may, for example, correspond to mechanical or magnetic target features such as tooth edges, tooth centers, notch centers, pole boundaries, or pole maxima.

The controller 160, which has a first terminal 160a coupled to the control terminal 110b of current source 110, a second terminal 160b coupled to the control terminal 120b of current modulation circuit 120, and a third terminal 160b coupled to the control terminal 150b of gain adjustable circuit 150 in the example embodiment shown, detects switchpoints (or switchpoint windows, as will be discussed) of the circuit 100. in response to the switchpoints detected, controller 160 generates at least one of the current source control signal, the current modulation control signal and the gain control signal. Additionally, in one embodiment, the gain control signal is generated and provided to the control terminal 150b in response to a change in at least one of the current source control signal and the current modulation control signal.

For example, controller 160 can generate a gain control signal capable of reducing the gain of the gain adjustable circuit 150 (e.g., from a second gain level to a first, lower gain level of a plurality of gain levels) and, thus, the gain level of the gain adjusted signal provided at the output (i.e., output terminal 150c) of gain adjustable circuit 150, in response to an increase in a current level of current signals received by sensing element 130 provided for by at least one of the current source control signal and the current modulation control signal (e.g., such that the gain level of the gain adjusted signal remains substantially constant whether or not the output of the circuit is operating at or near a switchpoint).

In some embodiments of circuit 100 including both the current source 110 and the current modulation circuit 120, the first current signal generated by the current source 110 may be a substantially constant current signal having a first current level. Moreover, the second current signal generated by the current modulation circuit 120 may be a modulated current signal capable of increasing the current signals received by sensing element 130 from a first current level to a second, higher current level of a plurality of current levels in accordance with the one or more switchpoints of circuit 100.

Further aspects of the concepts, systems, circuits and techniques sought to be protected herein, with particular emphasis on operation of the circuits, are described in conjunction with the figures below.

Figure 2:
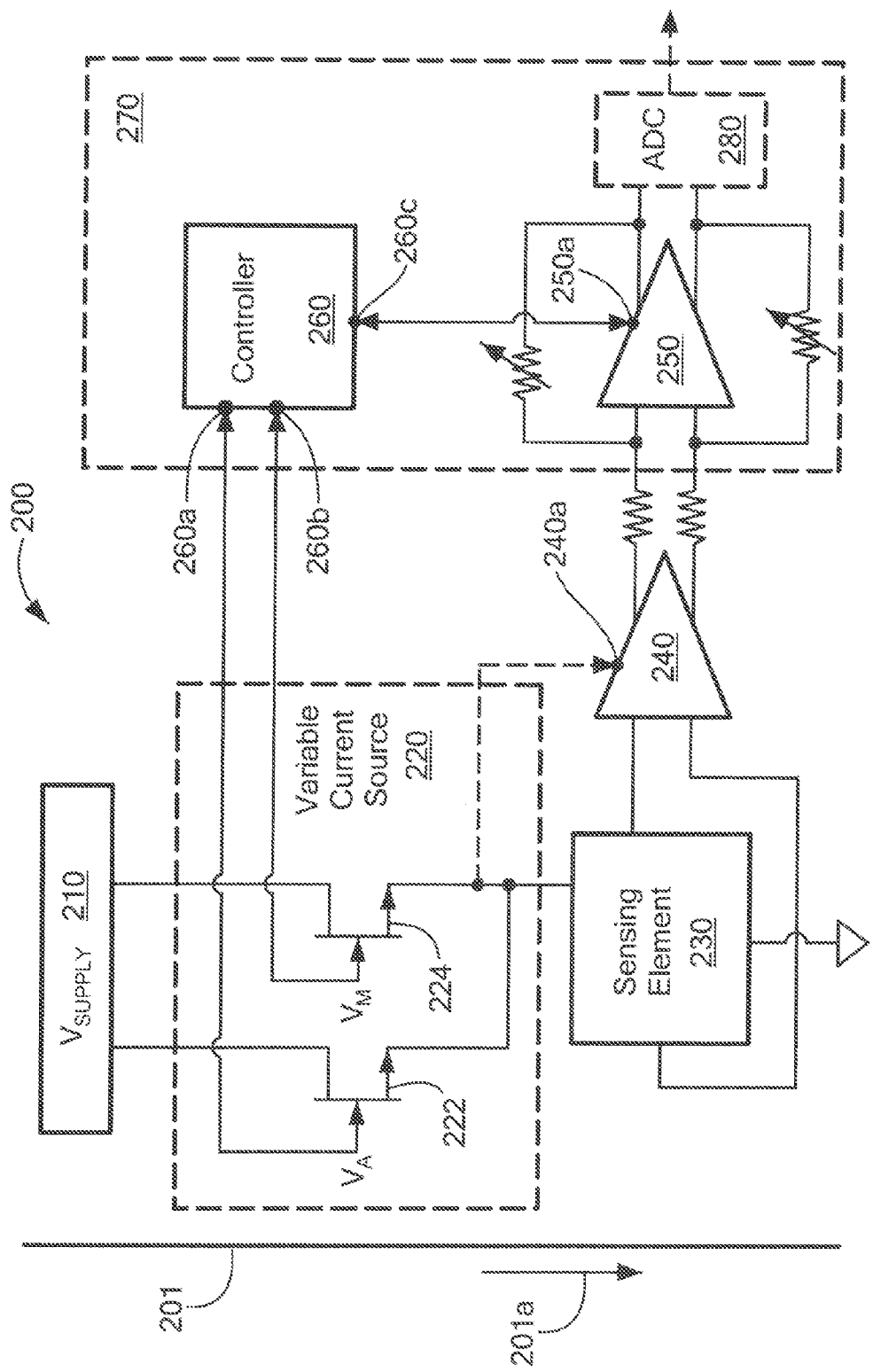
FIG. 2 is a block diagram of an example circuit including a plurality of current sources, at least one sensing element, a gain adjustable circuit and a controller.

Referring now to FIG. 2, another example circuit 200 includes a voltage supply 210 coupled to first and second current sources 222, 244, which are coupled to an input of a sensing element 230. The circuit 200 also includes a signal path (e.g., an analog, digital or mixed signal path) comprising an amplifier 240, a gain adjustable circuit 250 and an analog-to-digital converter (ADC) 260 driven by an output of the gain adjustable circuit 250. The ADC 280 is optional in some embodiments (e.g., when the output of gain adjustable circuit 250 is a digital output) and is thus shown in phantom in FIG. 2. The amplifier 240, which may be the same as or similar to the amplifier 140 of FIG. 1, has at least one input adapted to couple to an output of the sensing element 230 and at least one output adapted to couple to an input of the gain adjustable circuit 250. The ADC 280 has an output adapted to couple to an output of the circuit 200. In this example embodiment, circuit 200 further includes control circuitry 270 (e.g., gain and current control circuitry) including a controller 260 adapted to couple to corresponding control terminals of first current source 222, second current source 224 and gain adjustable circuit 250.

Sensing element 230 is responsive to a magnetic field as may be generated, for example, by a current 201a passing through a current-carrying conductor 201 proximate sensing element 230. Current-carrying conductor 201 can be a part of the circuit 200, external to the circuit 200, or a combination thereof. Sensing element 230 is driven by the first and second current sources 222, 224, which may, for example, be the same as or similar to the current source 110 and the current modulation circuit 120 of FIG. 1, respectively, and provided as part of a variable current source 220. The variable current source 220 is optional in some embodiments and is thus shown in phantom in FIG. 2. The first and second current sources 222, 224 are, in turn, driven by the voltage supply 210. In an automotive application, for example, the voltage supply 210 may be provided as part of an automotive power system that can include an automobile battery (not shown).

In the example embodiment shown, the first and second current sources 222, 224 each comprise a three terminal device (e.g., a field-effect transistor (FET)) having a first terminal (e.g., a drain terminal) adapted to couple to an input of the sensing element 230, a second, control terminal (e.g., a gate terminal), and a third terminal (e.g., a source terminal) adapted to couple to an output of the voltage supply 210. The first and third terminals of each three terminal device provide current conducting terminals of the first and second current sources 222, 224. Additionally, the control terminals of each three terminal device may be coupled to corresponding terminals of the controller 260 for receiving a control signal (e.g., a first control signal and/or a second control signal).

The first current source 222 receives a voltage signal from the voltage supply 210 at the third terminal of first current source 222, a control signal (denoted by $V_A$) from a first terminal 260a of controller 260 at the second terminal of first current source 222, and in response thereto generates a first current signal at the first terminal of first current source 222. The control signal $V_A$, which may be the same as or similar to the current source control signal provided to the control terminal of current source 110 of FIG. 1, can be provided as a voltage signal (e.g., a gate input voltage signal) having a voltage level sufficient to "switch" the first current source 222 "on" such that current (e.g., drain current, Id) flows through the current conducting terminals of the first current source 222 to the sensing element input. The control signal $V_A$ can also control a current level of the first current signal and, in some embodiments, control a current level of the one or more current signals received by the sensing element 230.

Similar to the first current source 222, the second current source 224 receives a voltage signal from the voltage supply 210 at the third terminal of second current source 224, a control signal (here denoted by $V_M$) from a second terminal 260b of controller 260 at the second terminal of second current source 224, and in response thereto generates a current signal (here a second current signal) at the first terminal of second current source 224. Here, however, as one example, the control signal $V_M$, which may be the same as or similar to the current modulation control signal provided to the current modulation circuit 120 of FIG. 1 in some embodiments, is provided as a modulated voltage signal (e.g., a gate input voltage signal) having a voltage level sufficient to "switch" the second current source 224 "on" such that current (e.g., drain current (Id)) flows through the current conducting terminals of the second current source 224 to the sensing element input in response to the output of circuit 200 operating at or near a switchpoint (e.g., a first switchpoint). The control signal $V_M$ can also control a current level of the second current signal and, in some embodiments, control the current level of current signals received by the sensing element 230. Additionally, in embodiments where the first terminal of second current source 224 is coupled to a control terminal 240a of amplifier 240, the control signal $V_M$ controls a current level of current signals received by the amplifier 240.

The sensing element 230 receives current signals comprising at least the first current signal (and, in some embodiments the second current signal) at an input thereof. In response to the current signals provided thereto and the sensing element 230 sensing one or more sense parameters (e.g., a sensed magnetic field through current-carrying conductor 201), sensing element 230 generates a sensed output signal at an output thereof. Similar to circuit 100 of FIG. 1, circuit 200 is provided having one or more corresponding points (i.e., switchpoints) at which a characteristic of an output of said circuit transitions in response to one or more of the sense parameters being greater than or less than a threshold value. The circuit 200 also has a sensitivity (and SNR) that is substantially proportional to the current level of the current signals provided thereto (e.g., from first and second current sources 222, 224).

The current level of the current signals provided thereto increases from a first current level to a second, higher current level (e.g., via an increase in current provided by the first and/or second current sources 222, 224) when the output of circuit 200 is operating at or near a first switchpoint corresponding to one or more of the sense parameters being greater than the threshold value (e.g., a predetermined magnetic flux level). Additionally, the current level of the current signals provided thereto decreases from the second, higher current level to the first current level (e.g., via a decrease in current provided by the first and/or second current sources 222, 224) when the output of circuit 200 is not operating at or near the first switchpoint (i.e., is less than the threshold value). Although first and second current levels are described, the current signals can, of course, include more than the first and second current levels.

The amplifier 240 receives the sensed output signal at the input thereof and in response thereto generates an amplified signal at an output thereof. The amplified signal can be fed directly to the gain adjustable circuit 250 in some embodiments, or accessed externally for further signal processing circuitry (not shown) in other embodiments before being provided to the gain adjustable circuit 250. Similar to amplifier 140, in embodiments where amplifier 240 has a control terminal 240a and amplifier 240 is configured to receive an amplifier current control signal (or a current signal) from second current source 224 at the control terminal 240a, a current level of current signals received by amplifier 240 may be controlled.

The gain adjustable circuit 250, which may be the same as or similar to the gain adjustable circuit 150 of FIG. 1 and may be provided having a gain range that can, for example, be digitally programmed, receives the amplified signal at the input thereof. In response to the amplified signal provided thereto and a gain control signal received at a control terminal 250a of the gain adjustable circuit 250 (e.g., from the controller 260), gain adjustable circuit 250 provides a gain adjusted signal having an associated gain level (e.g., of a plurality of potential gain levels) at an output thereof (i.e., an output terminal).

The gain provided by gain adjustable circuit 250 (and thus used in generating the gain adjusted signal) decreases from a second gain level to a first, lower gain level (e.g., in response to controller 260 detecting an increase in the current level of the current signals received at the sensing element input, controller 260 generating a corresponding gain control signal, and gain adjustable circuit 250 receiving the gain control signal) when the output of circuit 200 is operating at or near the first switchpoint. Moreover, the gain of the gain adjustable circuit 250 increases from the first, lower gain level (e.g., a gain level that contains about half of the gain of the second gain level) to the second gain level (e.g., in response to controller 260 detecting a decrease in the current level of the current signals received at the sensing element input, controller 260 generating a corresponding gain control signal, and gain adjustable circuit 250 receiving the gain control signal) when the output of circuit 200 is not operating at or near the first switchpoint. Decreasing the gain of the gain adjustable circuit 250 from the second gain level to the first, lower gain level (or from any number of gain levels of the plurality of gain levels to a lower gain level) can, for example, correspond to a decrease in amplitude of current signals used to power the gain adjustable circuit 250 (e.g., from the voltage supply 210). In one embodiment, the gain level of the gain adjusted signal generated at the output of the gain adjustable circuit 250 remains substantially constant whether or not the output of circuit 200 is operating at or near the first switchpoint.

The ADC 280 receives the gain adjusted signal at the input thereof and in response thereto generates a corresponding digital signal at an output thereof. The digital signal may, for example, be indicative of a sensed magnetic field and be received at an output of the signal path, an input of controller 260 (not shown), and/or an output of the circuit 200.

Although the circuit 200 is described as including a signal path comprising an amplifier 240, a gain adjustable circuit 250, and, in some embodiments, an ADC 280, it should, of course, be appreciated that the signal path may comprise additional circuitry including filters, summing circuits, and the like, for processing the sensed output signals provided thereto. The signal path discussed herein is used to promote simplicity, clarity and understanding in the description of the concepts, circuits, systems and techniques sought to be protected herein and is not intended to be, and should not be construed as, limiting.

Additionally, in some embodiments, the circuit 200 is provided having several operational modes (e.g., "standby" mode, "run" mode) for which the current level of current signals received by sensing element 230 vary. For example, during an example standby mode where the sensing element 230 is engaged in intermittent or periodic measurements of the one or more sense parameters, the current level of current signals received by sensing element 230 may be at first current level (e.g., sensing element 230 receives a so-called "trickle" of current). In contrast, during an example run mode where the sensing element 230 is engaged in substantially continuous measurements of the one or more sense parameters, the current level may be at a second, higher current level. The circuit 200 may switch from the example standby mode to the example run mode when the output of circuit 200 is operating at or near the first switchpoint. Moreover, in some embodiments, once the circuit 200 switches from the example standby mode to example run mode, the circuit 200 may remain in the example run mode until one or more of the sense parameters are removed or are less than a threshold value (or signal).

Figure 2A:
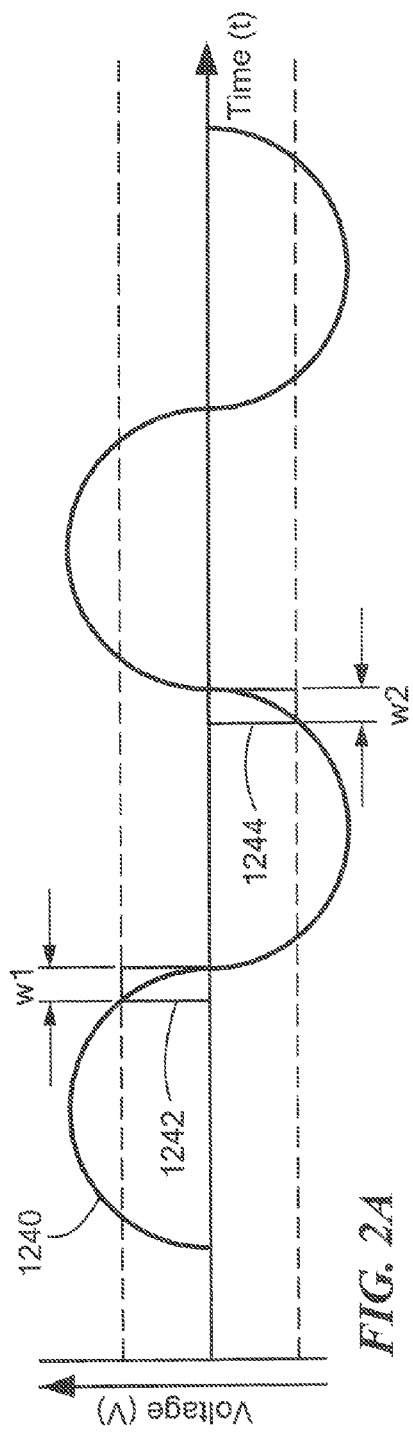
FIG. 2A is a plot of voltage versus time illustrating example switchpoint windows of an example output signal of an example circuit such as the circuits of FIGS. 1 and 2, for example.

Referring now to FIG. 2A, an example plot of voltage versus time illustrating example switchpoint "windows" (i.e., a predetermined interval of time) during which a characteristic of an output of a circuit (e.g., circuit 200, shown in FIG. 2) may change or transition from one state or value to a different state or value. It is to be appreciated that although units are shown on the axes of plots illustrated in FIGS. 2A-2D and 4 the figures are used for illustration purposes and may not be drawn to scale.

A signal 1240 shown in FIG. 2A may, for example, correspond to an output signal of the circuit (e.g. an output signal of gain adjustable circuit 150 in FIG. 1 or an output signal of ADC 280 in FIG. 2). Such an output signal may, for example, represent a position of an object, e.g., gear teeth of a ferromagnetic gear, with respect to the sensing element. A change in position of the object may, for example, result in a corresponding change in a sense parameter (e.g., magnetic field) sensed by the sensing element.

In the example embodiment shown, the circuit has a plurality of switchpoint windows, here first and second switchpoint windows 1242, 1244, per signal cycle (or period) with window widths of w1 and w2, respectively. In other embodiments, the circuit may have one or more switchpoint windows per signal cycle. An example of a single switchpoint window is discussed below in conjunction with FIG. 2D, for example. A switchpoint may, for example, occur substantially anywhere within the switchpoint windows (here, first and second switchpoint windows 1242, 1244), which may correspond to a predetermined percentage (e.g., twenty-five percent, fifty percent, etc.) of the output of the circuit (here, signal 1240). As illustrated in the embodiment of FIG. 2A, the first and second switchpoint windows 1242, 1244 may exist at substantially equivalent field strengths of the signal 1240 but at substantially opposite polarities (i.e., positive and negative polarities). The switchpoint windows 1242, 1244 may be used by control circuitry (e.g., 270, shown in FIG. 2) in the circuit for controlling the current level of the current signals received by the sensing element and, optionally, an amplifier (e.g., 240, shown in FIG. 2) of the circuit. The switchpoint windows 1242, 1244 may also be used for controlling gain of a gain adjustable circuit (e.g., 250, shown in FIG. 2).

Figure 2B:
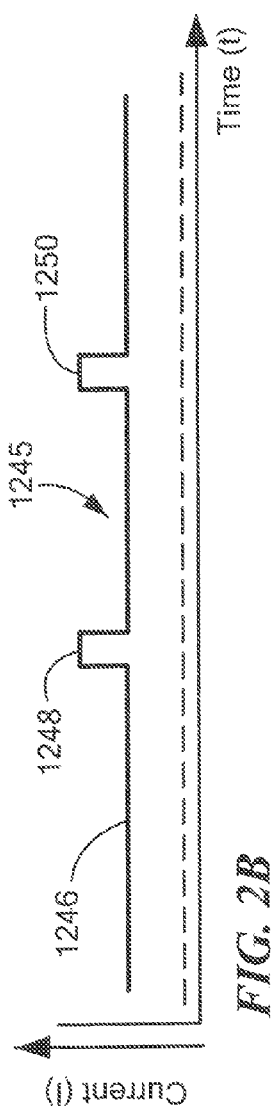
FIG. 2B is a plot of current versus time illustrating a current signal as may be generated by the current source or the current modulation circuit of FIG. 1 or the plurality of current sources of FIG. 2 in response to switchpoints occurring within the switchpoint windows shown in FIG. 2A, for example.

Referring now to FIG. 2B, an example plot of current versus time illustrating a current signal 1245 as may be generated by one or more current sources (e.g., 222, shown in FIG. 2 taken alone or in combination with 224, shown in FIG. 2) in response to the first and second switchpoint windows 1242, 1244 shown in FIG. 2A, for example, is shown. The plot has a horizontal axis with a scale in time units (t) and a vertical axis with a scale in current units (I). As illustrated, the current level of the current signal 1245 may be modulated (or increased) from a first current level 1246 to a second, higher current level (e.g., of a plurality of current levels) at or near a point (i.e., a switchpoint) within (or substantially before) the first switchpoint window (1242, shown in FIG. 2A) and at or near a point within (or substantially before) the second switchpoint window (1244, shown in FIG. 2A), as denoted by pulses 1248 and 1250, respectively. In the example embodiment shown, the current level of the current signal 1245 is at the first current level 1246 when the output of the circuit is not operating within the first and second switchpoint windows 1242, 1244. In other embodiments, the current level of the current signal 1245 may be modulated (or increased) from the first current level 1246 to the second, higher current level at or near a point (i.e., a switchpoint) before a positive peak of the output of the circuit (e.g., as indicated by a first point of 2240, shown in FIG. 2D, as will be discussed). Additionally, the current level of the current signal 1245 may be decreased from the second current level to the first current level at or near a point (i.e., a switchpoint) after a negative peak of the output of the circuit (e.g., as indicated by a second point of 2240, shown in FIG. 2D, as will be discussed).

Figure 2C:
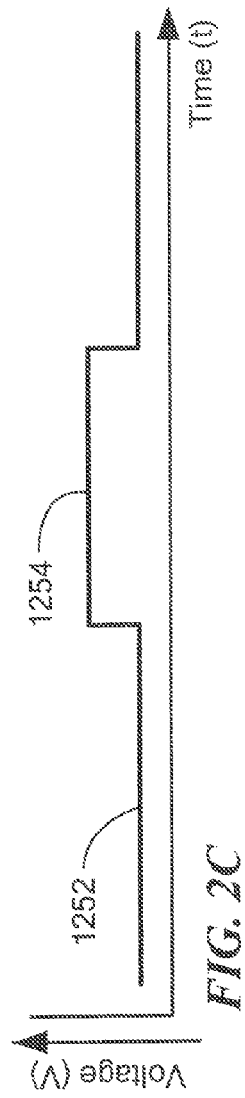
FIG. 2C is a plot of voltage versus time illustrating state changes of an example signal in a controller in a circuit in response to the switchpoints shown in FIG. 2A, for example.

Referring now to FIG. 2C, an example plot of voltage versus time illustrating state changes of an example signal in a controller (e.g., 260, shown in FIG. 2) of a circuit (e.g., 260, shown in FIG. 2) in response to an output of the circuit operating within a particular range of the first and second switchpoint windows 1242, 1244 of FIG. 2A is shown with a horizontal axis with a scale in time units (t). As illustrated, the example signal changes states (or logic levels, as recognized by digital circuitry) at or near an edge of the first switchpoint window (1242, shown in FIG. 2A) and at or near a corresponding edge of the second switchpoint window (1244, shown in FIG. 2A in the example embodiment shown.

Figure 2D:
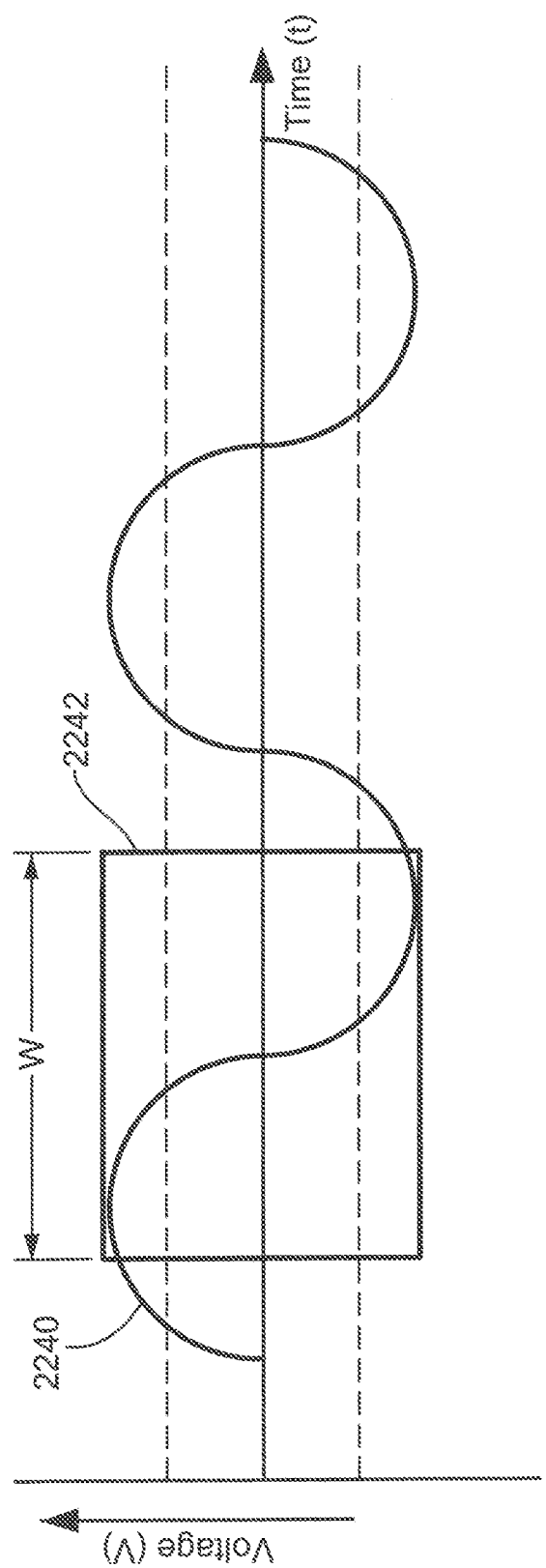
FIG. 2D is a plot of voltage versus time illustrating a switchpoint window of an example circuit which may be the same as or similar to the circuits described in conjunction with FIGS. 1 and 2, for example.

Referring now to FIG. 2D, another example plot of voltage versus time illustrating example switchpoints (e.g., switchpoints in an example switchpoint window) of another example output of a circuit (e.g., 200, shown in FIG. 2) including a sensing element (e.g., 230, shown in FIG. 2) is shown with a horizontal axis with a scale in time units (t) and a vertical axis with a scale in voltage units (V). A signal 2240, similar to the signal 1240 discussed above in conjunction with FIGS. 2A-2C, may, for example, correspond to an output of the circuit in terms of position of an object with respect to the sensing element.

In the example embodiment shown, the circuit has one switchpoint window 2242 per signal cycle with a window width of W. Switchpoint window 2242 extends from a first point substantially before a positive peak of signal 2240 (e.g., eighty-degrees of signal cycle) to a second point substantially after a negative peak of signal 2240 (e.g., two-hundred eighty-degrees of signal cycle). It should, of course, be appreciated that in other embodiments switchpoint window 2242 may have a window width that is greater than or less than W and the positions of the first and second points may accordingly be varied. Similar to the output of the circuit shown in FIG. 2A, a switchpoint may, for example, occur substantially anywhere within switchpoint window 2242.

In embodiments where the threshold value (or threshold signal) at which a characteristic of the output of the circuit transitions is provided as a predetermined percentage of a peak-to-peak value of positive and negative peaks of the sensed output signal (e.g., as may be found in a peak-to-peak signal), for example, it may be desirable to have a switchpoint window with a window width that is greater than a predetermined portion of a signal period (e.g., half a signal period). Such may provide for more accurate detection of the positive and negative peaks of the sensed output signal (and, thus, positive and negative peaks of the output of the circuit). For example, increased current experienced by a sensing element at or near positive and negative peaks of a sensed output signal (e.g., in a so-called "high current" or "high accuracy" mode) may provide for a more accurate determination of the peaks. Since switchpoint(s) are often based on the peaks (i.e., the positive and negative peaks) when current is increased at or near the switchpoint(s), in response thereto, a characteristic of an output of the circuit will switch (or transition) at a highly accurate position.

Additionally, in some embodiments, it may be desirable to modulate (or increase) the current level of the current signal(s) received by a sensing element at or near the switchpoint(s) of the circuit in addition to at or near positive peaks and/or at or near negative peaks of the output of the circuit per signal cycle (e.g., where the switchpoint(s) do not occur at or near positive peaks and/or at or near negative peaks of the output of the circuit).

As one example, the current level of the current signal(s) received by a sensing element may be modulated at a first percentage (e.g., ninety percent) of a peak-to-peak value of a positive peak of the sensed output signal and decreased at a second percentage (e.g., eight-five percent) of a peak-to-peak value of the positive peak of the sensed output signal. The current level may also be modulated at or near a second switchpoint of the circuit and decreased after the first switchpoint. Additionally, the current level may be modulated at a third percentage (e.g., ten percent) of a peak-to-peak value of a negative peak of the sensed output signal and decreased at a fourth percentage (e.g., fifteen percent) of a peak-to-peak value of the negative of the sensed output signal. Further, the current level may be modulated at or near a first switchpoint of the circuit and decreased after the first switchpoint. The above example may provide for improved SNR at example positive and negative peaks of sensed output signal (and, thus, positive and negative peaks of the output of the circuit) and at example first and second switchpoints of the circuit.

Figure 3:
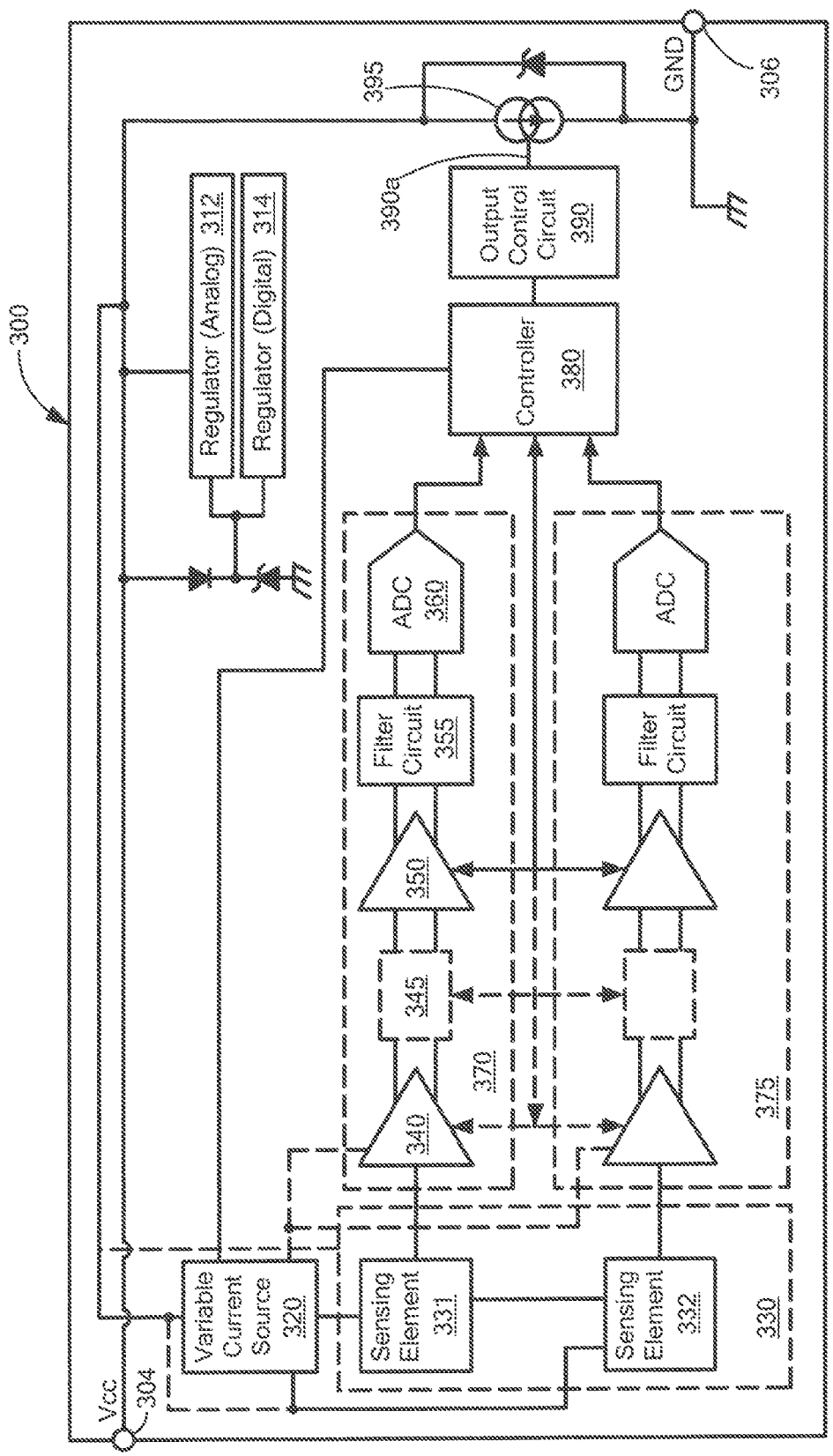
FIG. 3 is a block diagram of an example circuit including a voltage source, a current source, a plurality of sensing elements, a gain adjustable circuit and a controller.

Referring now to FIG. 3, another example circuit 300 in accordance with the concepts, systems, circuits and techniques sought to be protected herein includes first and second terminals 304, 306 disposed thereon. The first terminal 304 of the circuit 300 is adapted to couple to a power supply, denoted as Vcc, and the second terminal 306 is adapted to couple to a reference potential, such as ground, denoted as GND. The circuit 300 also includes first and second regulator circuits 312, 314 having inputs coupled to the first terminal 304. A current source 320 (e.g., a variable current source) is coupled to corresponding inputs of a plurality of sensing elements 330. The circuit 300 further includes one or more signal paths, here denoted 370, 375, having inputs coupled to corresponding outputs of the plurality of sensing elements 330. The circuit 300 additionally includes a controller 360 coupled to outputs of the signal paths 370, 375 and an output control circuit 390 coupled to an output of the controller 380. The controller 380 is also coupled to a control terminal of current source 320 and control terminals of one or more components in signal paths 370, 375. An output of the output control circuit 390 is coupled to a current source 395.

First and second regulator circuits 312, 314 receive a voltage signal from the first terminal 304 at inputs thereof. In response to the voltage signal provided thereto, first and second regulator circuits 312, 314 generate and provide a regulated voltage, which has a substantially constant voltage value, at outputs thereof.

The current source 320, which can be the same as or similar to the first and/or second current sources 222, 224 of FIG. 2, for example, receives the regulated voltage at an input thereof (i.e., an input terminal) and a control signal from the controller 380 at a control terminal. In response thereto, current source 320 generates a first current signal at an output thereof (i.e., an output terminal). A current level of the first current signal is controlled (i.e., increased, decreased, or maintained) by the control signal received at the control terminal from the controller 380. Additionally, in embodiments where current source 320 has a terminal coupled to control terminals of circuitry in signal paths 370, 375 (e.g., amplifier 340, as will be discussed), the control signal received from controller 380 may also control a current level of current signals received by corresponding circuitry in signal paths 370, 375 (e.g., amplifier 240, as will be discussed).

Figures 3A, 3B:
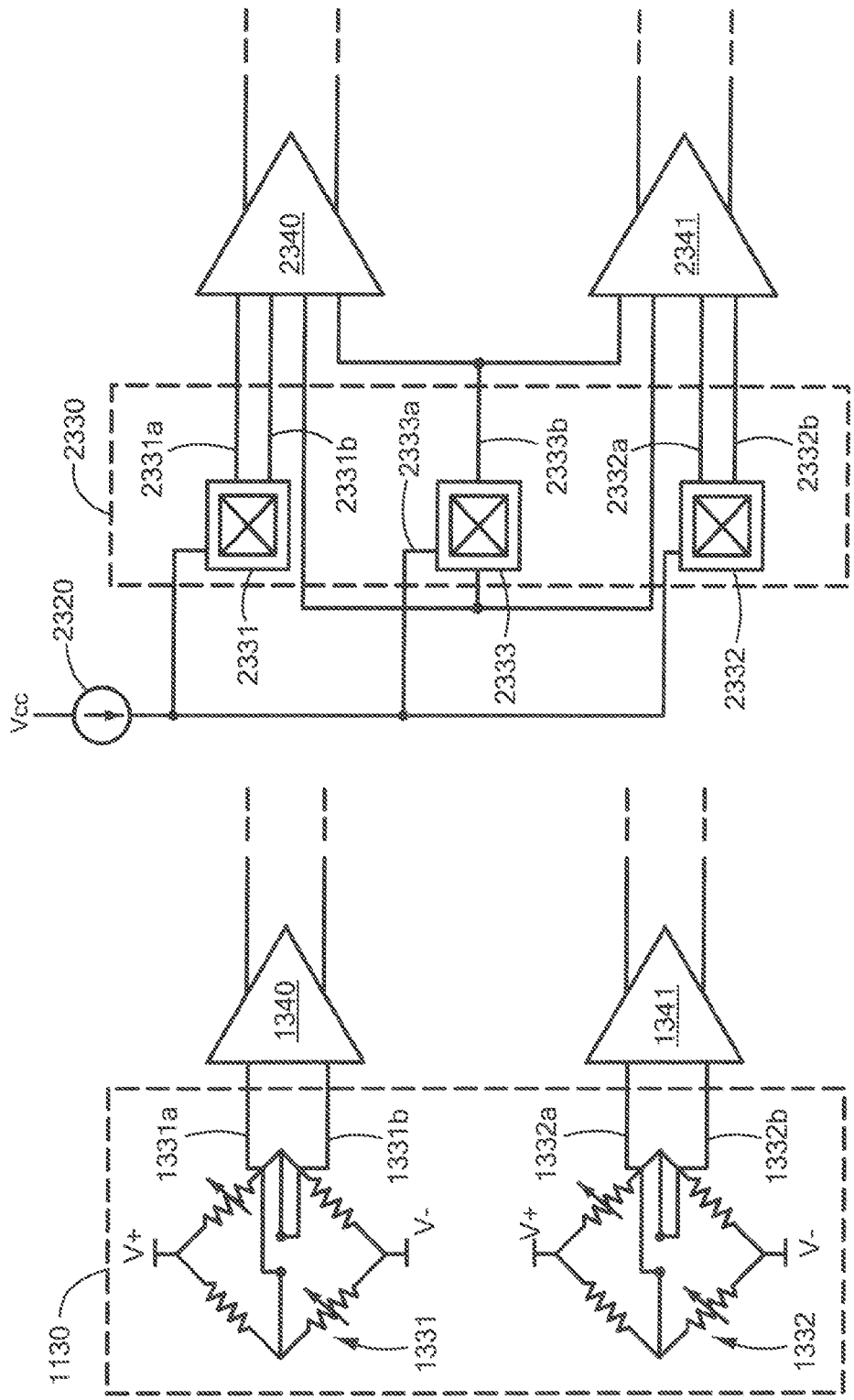
FIG. 3A is a block diagram of an example configuration of a plurality of sensing elements suitable for use with the circuit of FIG. 3, for example.
FIG. 3B is a block diagram of another example configuration of a plurality of sensing elements suitable for use with the circuit of FIG. 3, for example.

The plurality of sensing elements 330, here first and second sensing elements 331 and 332, receives the first current signal at inputs thereof. In response to the first current signal provided thereto and the first and second sensing elements 331, 332 sensing one or more sense parameters (e.g., a magnetic field), the first and second sensing elements 331, 332 generate first and second sensed output signals, respectively, at outputs thereof. Example configurations of the plurality of sensing elements 330 (and the first and second sensing elements 331 and 332) are shown in FIGS. 3A and 3B, for example. Similar to circuits 100 and 200 of FIGS. 1 and 2, respectively, circuit 300 is provided having one or more corresponding points (i.e., switchpoints) at which a characteristic of an output of circuit 300 transitions in response to one or more of the sense parameters being greater than or less than a threshold value.

The one or more signal paths, here first and second paths 370, 375, receive the first and second sensed output signals at inputs thereof. Taking a first one of the signal paths 370 as representative of the first and second signal paths 370, 375, the first signal path 370 includes an amplifier 340, a circuit 345, a gain adjustable circuit 350, a filter 355 and an ADC 360. The circuit 345 is optional in some embodiments and is thus shown in phantom. The amplifier 340 has an input adapted to couple to an input of the signal path (and, thus, an output of the first sensing element 331), an output adapted to couple to an input of the circuit 345 and, optionally, a control terminal adapted to couple to a terminal of current source 320 (e.g., for receiving a current signal for controlling a current level of current signals received by amplifier 340, as will be discussed). The circuit 345 has an output adapted to couple to an input of the gain adjustable circuit 350 and the gain adjustable circuit 350 has an output adapted to couple to an input of the filter circuit 355. The filter 355 has an output adapted to couple to an input of the ADC 360 and the ADC 360 has an output adapted to couple to an output of the signal path (and, thus, an input of the controller 380).

The amplifier 340 receives the first sensed output signal at an input thereof and in response thereto generates an amplified signal at output thereof. In some embodiments, the amplifier 340 additionally receives an amplifier current control signal (or current signal) from a terminal on the current source 320 and/or a gain control signal from an output of the controller 380. The amplifier current control signal may control a current level of current signals received by amplifier 340 (and, thus, improve the SNR ratio of the circuit 300) and the gain control signal may control gain of the amplifier 350 (and, thus, gain of the amplified signal generated by the amplifier 340). The current level of current signals received by amplifier 340 may, for example, be adjusted (i.e., increased or decreased) at a same or similar time as a corresponding increase or decrease in the current level of the first current signal received by the plurality of sensing elements 330 (e.g., at a switchpoint of the circuit 300).

The circuit 345, which may be provided as an offset adjustable circuit, for example, receives the amplified signal at an input thereof. In response to the amplified signal provided thereto, the circuit 345 generates an offset adjusted signal at output thereof.

The gain adjustable circuit 350 receives the offset adjusted signal at an input thereof (i.e., an input terminal) and a gain control signal at a control terminal of the gain adjustable circuit from an output of the controller 380. In response thereto, the gain adjustable circuit 350 provides a gain adjusted signal having an associated gain level (e.g., of a plurality of potential gain levels) at output thereof (i.e., an output terminal). The gain control signal controls the gain of the gain adjustable circuit 350 (and, thus, the gain level of the gain adjustable signal generated by the gain adjustable circuit 350). Similar to amplifier 340, the gain of gain adjustable circuit 350 may be increased or decreased (e.g., at or near a switchpoint of circuit 300) in response to a corresponding decrease or increase in the current level of the first current signal received by the plurality of sensing elements 330. As one example, the gain of gain adjustable circuit 350 may be increased in response to a decrease in the first current signal, or vice versa. In some embodiments, the increase or decrease in the gain may occur at a same or similar time as the decrease or increase in the current level of the first current signal.

The filter 355, which may be implemented as an active or passive filter, for example, receives the gain adjusted signal at an input thereof. In response to the gain adjusted signal provided thereto, the filter 355 provides a filtered signal at an output thereof. The filter 355 may, for example, be provided as a filtering device having a low-pass filter characteristic for attenuating portions of the gain adjusted signal that are outside of a desired frequency passband.

The ADC 360 receives the filtered signal at an input thereof and in response thereto generates a corresponding digital signal at an output thereof. In the example embodiment shown, the digital signal is received at an output of the signal path 370.

The controller 380, which can be a synchronous digital controller or an analog controller, for example, receives the digital signals generated by the first and second signal paths 370, 375 at inputs thereof. In response to the digital signals provided thereto, the controller 380 generates a controller signal at an output thereof. The controller 380 also generates and provides a control signal to the current source 320 for controlling a current level of the first current signal received by the plurality of sensing elements 330, a gain control signal to be received by gain adjustable circuit 360 and, optionally, a gain control signal to be received by amplifier 340, as discussed above.

The output control circuit 390 receives the controller signal at an input thereof and in response thereto generates an output signal 390a (e.g., an output of the circuit 300) at an output thereof. In embodiments where the controller circuit 380 is provided as a synchronous digital controller, for example, the output control circuit 390 may be provided as an asynchronous output control circuit, for example. Additionally, the output signal 390a may be provided as a two state digital signal having edges that occur as edges of a target object (e.g., a ferromagnetic gear) pass by each of the plurality of sensing elements 330 (e.g., for which a high state is indicative of one of the teeth of the ferromagnetic gear being proximate the plurality of sensing elements 330 and for which a low state is indicative of one of the valleys of the ferromagnetic gear being proximate to the plurality of sensing elements 330).

In some embodiments, the circuit 300 may be provided as a two terminal device (i.e., with first and second terminals 304, 306, as in the example embodiment shown) for which the output signal 390a generated by the output control circuit 390 appears as a current signal superimposed on the power supply, Vcc, at the first terminal 304. Additionally, in some embodiments, the circuit 300 may be provided as a three terminal device (i.e., with an additional third terminal, not shown) at which the output signal 390a can be provided as a voltage or a current.

Moreover, in some embodiments, the current source 320 can be omitted, and the regulated voltage generated by the first and second regulator circuits 312, 314 can be coupled directly to the plurality of sensing elements 330, as indicated by the dashed line coupling the first and second regulator circuits 312, 314 to the plurality of sensing elements 330 in FIG. 3. In such embodiments, the plurality of sensing elements 330 can have a sensitivity (and SNR) that is proportional to the regulated voltage and controller 380 can control the regulated voltage and the current level of current signals received by the plurality of sensing elements 330 in response to the regulated voltage.

Additionally, in some embodiments, the plurality of sensing elements 330 can be arranged and coupled (e.g., in series or in parallel) to achieve a desired SNR. For example, in a circuit including two sensing elements with a first one of the sensing elements having an output coupled to an input of a signal path, a second one of the sensing elements may be arranged and coupled in parallel with the first one of the sensing elements to increase the SNR of the circuit. In a circuit including more than two sensing elements, the sensing elements may be switched in or out of a plurality of different configurations to achieve a desired SNR.

Furthermore, in some embodiments, the controller 380 may be configured to generate an offset control signal at an output thereof in response to receiving the digital signals generated by the ADCs of signal paths 370, 375 at inputs thereof. In such embodiments, the controller 380 has an output adapted to couple to a control terminal of the circuit 345 (as indicated by the dashed lines connecting controller 380 to circuit 345). The offset control signal may, for example, control the offset of the amplified signal generated by circuit 345 (e.g., resulting from offset errors of one or more of the first and second sensing elements 331, 332).

Moreover, in some embodiments, the control signal generated by the controller 380 and received by current source 320 may act as a switch for turning on or off the current modulation functionality of circuit 300 (and, thus, current source 320). As one example, the controller circuit 360 may turn off the current modulation functionality in embodiments where an object, e.g., gear teeth of a ferromagnetic gear, being sensed by the plurality of sensing elements 330 rotates with a relatively low rate-per-minute (RPM) with respect to the plurality of sensing elements 330 or substantially stops at or near one or more switchpoints (e.g., a first switchpoint) of the circuit 300. Turning off the current modulation functionality in some embodiments may, for example, ensure that the current level of the first current signal received by the plurality of sensing elements 330 does not remain at a second, higher current level for more than a predetermined time period. That is, allowing for the inclusion of a time-domain constraint on the modulation may prevent the system from operating in a high current mode for extended periods of time.

Referring now to FIG. 3A, an example configuration of a plurality of sensing elements 1330, which may be the same as or similar to the plurality of sensing elements 330 of FIG. 3 and suitable for use in the circuit 300, for example, is shown. The plurality of sensing elements 330 include first and second giant magnetoresistance (GMR) elements 1331, 1332 having first, supply terminals adapted to couple to a supply voltage (V+) and second, supply terminals adapted to couple to a reference voltage (V−). The supply voltage (V+) may be the same as or similar to the regulated voltage of FIG. 3 and the reference voltage (V−) may be the same as or similar to the reference potential (e.g., GND) of FIG. 3. Also, as discussed above in conjunction with FIG. 3, the regulated voltage may be received by a current source (e.g., 320, shown in FIG. 3 with the current source configured to generate and provide a first current signal to the plurality of sensing elements 1330.

The first and second GMR elements 1331, 1332 also have first and second output terminals adapted to couple to respective inputs of amplifiers 1340, 1341, which may be the same as or similar to amplifier 340 of FIG. 3. The first GMR element 1331 is configured to generate a first differential signal 1331*a*, 1331*b* and the second GMR element 1332 is configured to generate a second differential signal 1332*a*, 1332*b* in response to a sensed magnetic field (i.e., a sense parameter) and provide the signals to the respective inputs of the amplifiers 1341, 1342.

Referring now to FIG. 3B, another example configuration of a plurality of sensing elements 2330 is shown. The plurality of sensing elements 2330 are driven by a current source 2320 (e.g., similar to 320, shown in FIG. 3) and include first, second and third Hall effect elements (also referred to as "Hall elements") 2331, 2332, 2333, as may be a suitable configuration in a rotation detector circuit, for example. The first, second and third Hall elements 2331, 2332, 2333 are configured in pairs, with a first one of the pairs comprising the first and third Hall elements 2331, 2333 and having outputs adapted to couple to respective inputs of amplifier 2340 and a second one of the pairs comprising the second and third Hail elements 2332, 2333 and having outputs adapted to couple to respective inputs of amplifier 2341.

The first Hall element 2331 is configured to generate a first differential signal 2331*a*, 2331*b*, the second Hall element 2332 is configured to generate a second differential signal 2332*a*, 2332*b*, and the third Hall element 2333 is configured to generate a third differential signal 2333*a*, 2333*b* in response to a sensed magnetic field (i.e., a sense parameter). The first differential signal 2331*a*, 2331*b* and the third differential signal 2333*a*, 2333*b* are received at the respective inputs of the amplifier 2340 and the second differential signal 2332*a*, 2332*b* and the third differential signal 2333*a*, 2333*b* are received at the respective inputs of the amplifier 2341.

Although the plurality of sensing elements 1330, 2330 of FIGS. 3A and 3B are shown comprising first and second GMR elements 1331, 1332 and first, second and third Hall elements 2331, 2332, 2333, respectively, it should, of course, be appreciated that the plurality of sensing elements 1330, 2330 may take any form suitable for sensing one or more sense parameters (e.g., a magnetic field).

Figure 4:
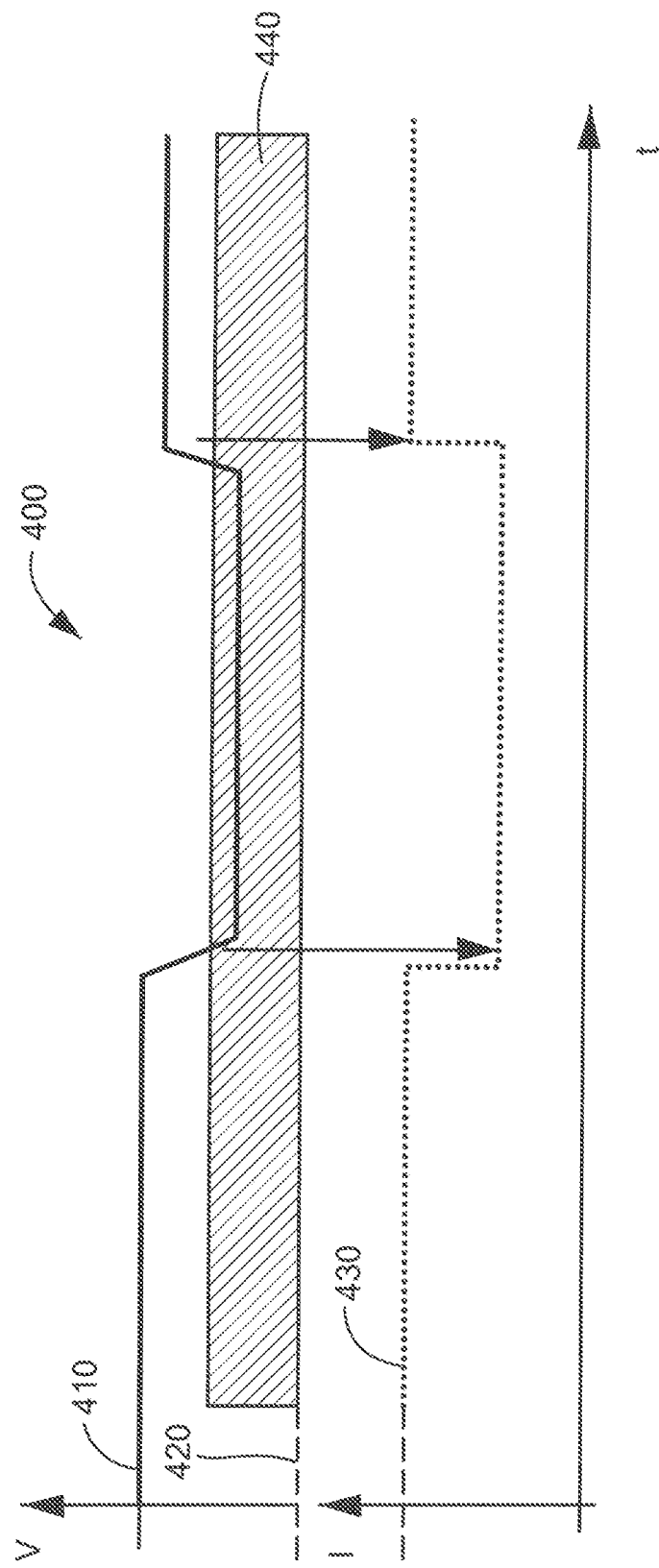
FIG. 4 is a plot of voltage level and current level versus time for a circuit which may be the same as or similar to the circuit of FIG. 3, for example.

Referring now to FIG. 4, an example plot 400 of voltage and current versus time for a circuit which may be the same as or similar to the circuit 300 of FIG. 3 is shown with a horizontal axis with a scale in time units (t) and a vertical axis with scales in voltage units (V) and current units (I). The voltage signal 410 may, for example, be representative of a voltage signal received from the power supply of FIG. 3 (denoted as VCC) at the first terminal 304. Additionally, the voltage signal 420 may be representative of a minimum voltage of the voltage signal received from the power supply of FIG. 3. In an automotive application, for example, the power supply can originate with an automotive battery, which can be subject to substantial voltage swings (i.e., between maximum and minimum voltage levels) during operation of an automobile (e.g., when an automobile engine is being started).

Further, the current signal 430 may be representative of a current signal (i.e., a first or a second current signal) that may be generated by a current source (e.g., 320, shown in FIG. 3) or, in some embodiments, a current signal (e.g., ICC current) as may be received at an input of a circuit (e.g., the first terminal 304 of circuit 300, shown in FIG. 3) which may include current flowing into the current source. The current signal may be received by one or more sensing elements (e.g., 331, 332, shown in FIG. 3).

As illustrated, the current level of the current signal 430 decreases from a first current level to a second, lower current level (e.g., of a plurality of current levels) in response to a decrease in a voltage level of the voltage signal 410 (or a reduction in available voltage headroom) from a first voltage level to a second, lower voltage level (e.g., of a plurality of voltage levels). The decrease in the voltage level may, for example, result from a so-called "brown-out" condition (i.e., an intentional or unintentional drop in voltage of the voltage signal), as indicated by brown-out region 440. The brown-out condition may, for example, occur due to a voltage drop in an automotive battery in an automotive application. In one embodiment, the one or more sensing elements receiving the current signal 430 are capable of operating at a reduced capability (e.g., a decrease in sensitivity of the one or more sensing elements to the one or more sense parameters) in response to a decrease in the current level of the current signal 430 (and voltage level of the voltage signal 410).

Additionally, as illustrated, the current level of the current signal 430 increases from the second, lower current level to the first current level of the plurality of current levels in response to an increase in voltage level of the voltage signal 410 (or an increase in available voltage headroom) from the second, lower voltage level to the first voltage level.

Furthermore, in some embodiments the current level of the current signal 430 can be increased from the second, lower current level to a current level that is substantially greater than the second, lower current level but substantially less than the first current level. As one example, such can occur in response to an increase in voltage (or an increase in available voltage headroom) from the second, lower voltage level (e.g., of the plurality of voltage levels) to a voltage level that is substantially greater than the second, lower voltage level but substantially less than the first voltage level and in response to the voltage level being above the brown-out region 440.

Additionally, in some embodiments, hysteresis and time averaging can be used to prevent transients in the voltage level of the voltage signal 410 from causing the current level of the current signal 430 from unexpectedly increasing or decreasing between the various current levels. For example, in some embodiments, the brown-out conditions discussed above may occur for a first period of time (e.g., a time greater than about ten microseconds (µs)) as the voltage level of voltage signal 410 enters brown-out region 440, in which case the current level of the current signal 430 may decrease from the first current level to the second, lower current level.

For other intentional or unintentional drops in the voltage level of the voltage signal 410 in the brown-region 440 which occur for a period of time that is less than the first period of time (e.g., less than about ten µs) due to energy coupling from an output of the circuit to a wiring harness, for example, it may be desirable for the current level of the current signal 430 to be substantially maintained. In such cases, a decrease in the voltage level of the voltage signal 410 can be sensed by one or more internal or external filtering devices of the circuit (e.g., bypass capacitors, resistors, and the like), for example, and hysteresis of the filtering devices can prevent the current level of current signal 430 from oscillating (e.g., between the first current level and the second, lower current level). Moreover, the filtering devices may delay sampling of the voltage level of the voltage signal 410 to allow transients in the voltage signal 410 to settle before increasing or decreasing the current level of the current signal 430.

By dynamically adjusting the current level of the current signal 430 as a function of the voltage level of the voltage signal 410, an improved SNR ratio is provided at an output of the circuit while also limiting the amount of current flowing into the circuit (e.g., 300, shown in FIG. 3). Additionally, in doing so, a larger sense resistor (e.g., a filter resistor having a larger opposition to current) can be used in the circuit (e.g., 300, shown in FIG. 3) comprising the sensing elements than otherwise could be provided (e.g., to provide additional filtering). If the voltage level of voltage signal 410 enters brown-out region 440, the current level of current signal 430 can be decreased from the first current level to the second, lower current level while still allowing for the sensing elements to continue to track sense parameters (e.g., a magnetic field).

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above. Accordingly, it is submitted that the scope of the patent should not be limited to the described embodiments but rather should be limited only by the spirit and scope of the following claims.

What is claimed is:

1. A circuit, comprising:
   a current source having at least a first terminal and a second, control terminal, said current source configured to receive a current control signal at the control terminal and in response thereto generate a first current signal at the first terminal, wherein the current control signal controls a current level of the first current signal;
   at least one sensing element responsive to one or more sense parameters and having an input adapted to couple to the first terminal of said current source, said sensing element configured to receive one or more current signals comprising at least the first current signal at the input thereof and in response thereto generate a sensed output signal at an output thereof;
   a gain adjustable circuit having at least a first, input terminal, a second, control terminal, and a third, output terminal, said gain adjustable circuit configured to receive a signal representative of the sensed output signal at the input terminal, a gain control signal at the control terminal, and in response thereto provide a gain adjusted signal having an associated gain level at the output terminal, wherein the gain control signal controls gain of said gain adjustable circuit; and a controller configured to provide at least the current control signal to the control terminal of said current source and the gain control signal to the control terminal of said gain adjustable circuit, wherein in response to an output of said circuit being at or near a first switchpoint corresponding to one or more of the sense parameters being greater than a threshold value, a current level of the current signals received by said sensing element is configured to be increased from a first current level to a second, higher current level of a plurality of current levels and the gain of said gain adjustable circuit is configured to be decreased from a second gain level to a first, lower gain level of a plurality of gain levels, wherein the gain level of the gain adjusted signal remains substantially constant.

2. The circuit of claim 1 wherein the current level of the current signals received by said sensing element is configured to be decreased from the second, higher current level to the first current level of the plurality of current levels and the gain of said gain adjustable circuit is configured to be increased from the first, lower gain level to the second gain level of the plurality of gain levels when the output of said circuit is not at or near the first switchpoint.

3. The circuit of claim 1 wherein the current level of the current signals received by said sensing element is configured to be increased from the first current level to the second, higher current level of the plurality of current levels and the gain of said gain adjustable circuit is configured to be decreased from the second gain level to the first, lower gain level of the plurality of gain levels when the output of said circuit is at or near a second switchpoint that is substantially the same as the first switchpoint but of a substantially opposite polarity.

4. The circuit of claim 1 wherein the sense parameters comprise a measured magnetic field.

5. The circuit of claim 1 further comprising:
a current modulation circuit having a first terminal adapted to couple to the sensing element input and a second, control terminal, said current modulation circuit configured to receive a current modulation control signal at the control terminal and in response thereto generate a second current signal at the first terminal, wherein the current modulation control signal controls a current level of the second current signal and the second current signal is capable of increasing the current level of the current signals received by said sensing element from the first current level to the second, higher current level of the plurality of current levels.

6. The circuit of claim 5 wherein said controller provides the current modulation control signal to the control terminal of said current modulation circuit.

7. The circuit of claim 1 further comprising an amplifier having an input adapted to couple to the sensing element output and an output adapted to couple to the input terminal of said gain adjustable circuit, said amplifier configured to receive the sensed output signal at the input thereof and in response thereto generate an amplified signal at the output thereof.

8. The circuit of claim 7 wherein said amplifier is provided having a lower noise characteristic than said gain adjustable circuit.

9. The circuit of claim 7 wherein said amplifier has a current control terminal and said current source provides an amplifier current control signal to the current control terminal of said amplifier, wherein the amplifier current control signal controls a current level of current signals received by said amplifier.

10. The circuit of claim 7 wherein said amplifier has a gain control terminal and said controller provides a gain control signal to the gain control terminal of said amplifier, wherein the gain control signal controls a gain level of the amplified signal.

11. The circuit of claim 1 further comprising:
a voltage source adapted to couple to the sensing element input, wherein the current level of the current signals received by said sensing element is further configured to decrease from the first current level to the second, lower current level of the plurality of current levels in response to a decrease in a voltage level of said voltage source or a reduction in the available headroom of said voltage source from a first voltage level to a second, lower voltage level of a plurality of voltage levels.

12. The circuit of claim 1 wherein a signal-to-noise ratio (SNR) of the output of said circuit is increased from a first value to a second, higher value when the output of said circuit is at or near the first switchpoint.

13. The circuit of claim 1 wherein said gain adjustable circuit is provided as a variable resistor divider.

14. The circuit of claim 1 wherein said circuit is a magnetic field sensor.

15. The circuit of claim 1 wherein said sensing element comprises a Hall effect element.

16. The circuit of claim 1 wherein said sensing element comprises a magnetoresistance element, wherein said magnetoresistance element is one of: an anisotropic magnetoresistance (AMR) element, a giant magnetoresistance (GMR) element, a tunneling magnetoresistance (TMR) element, a magnetic tunnel junction (MTJ) element, or a spin valve element.

17. A method for modulating current in a circuit comprising at least one sensing element responsive to one or more sense parameters, the method comprising:
receiving one or more current signals comprising at least a first current signal at an input of the sensing element;
generating a sensed output signal at an output of said sensing element in response to the current signals;
receiving a signal representative of the sensed output signal at a first, input terminal of a gain adjustable circuit and a gain control signal at a second, control terminal of the gain adjustable circuit, wherein the gain control signal controls gain of the gain adjustable circuit;
providing a gain adjusted signal having an associated gain level at a third, output terminal of the gain adjustable circuit in response to the signal representative of the sensed output signal and the gain control signal;
adjusting a current level of the current signals according to an output of the circuit, wherein in response to the output of the circuit being at or near a first switchpoint corresponding to one or more of the sense parameters being greater than a threshold value, the current level is configured to be increased from a first current level to a second, higher current level of a plurality of current levels; and
adjusting gain of the gain adjustable circuit according to the output of the circuit, wherein in response to the output of the circuit being at or near the first switchpoint, the gain of the gain adjustable circuit is configured to be decreased from a second gain level to a first, lower gain level of a plurality of gain levels, wherein the gain level of the gain adjusted signal generated by the gain adjustable circuit remains substantially constant.

18. The method of claim 17 wherein adjusting the current level of the current signals according to the output of the circuit comprises:

adjusting the current level of the first current signal according to the output of the circuit.

19. The method of claim 17 wherein adjusting the current level of the current signals according to the output of the circuit comprises:

adjusting the current level of the current signals according to the output of the circuit, wherein the current level of the current signals is configured to be decreased from the second, higher current level to the first current level when the output of the circuit is not at or near the first switchpoint.

20. The method of claim 17 wherein adjusting the current level of the current signals according to the output of the circuit comprises:

coupling a current modulation circuit to the sensing element, said current modulation circuit having a first terminal adapted to couple to the sensing element input and a second, control terminal;

generating a current modulation control signal for coupling to the control terminal of the current modulation circuit;

generating a second current signal at the first terminal of the current modulation circuit in response to the current modulation control signal, wherein the current modulation control signal controls a current level of the second current signal; and adjusting the current level of the current signals according to the output of the circuit by adjusting the current level of the second current signal.

* * * * *

UNITED STATES PATENT AND TRADEMARK OFFICE
CERTIFICATE OF CORRECTION

PATENT NO. : 9,523,742 B2  
APPLICATION NO. : 14/696674  
DATED : December 20, 2016  
INVENTOR(S) : Jay M. Towne et al.

Page 1 of 1

It is certified that error appears in the above-identified patent and that said Letters Patent is hereby corrected as shown below:

In the Specification

Column 10, Line 13 delete ". in response" and replace with --. In response--.

Column 11, Line 45 delete "(e.g., drain current, Id)" and replace with --(e.g., drain current (Id))--.

Column 15, Line 15 delete "(1244, shown in FIG. 2A" and replace with --(1244, shown in FIG. 2A)--.

Column 20, Line 27 delete "Hail elements" and replace with --Hall elements--.

Column 20, Line 56 delete "(denoted as VCC)" and replace with --(denoted as $V_{CC}$)--.

Column 22, Line 29 delete "computer readable" and replace with --computer-readable--.

Signed and Sealed this  
Eleventh Day of July, 2017

Joseph Matal  
*Performing the Functions and Duties of the*  
*Under Secretary of Commerce for Intellectual Property and*  
*Director of the United States Patent and Trademark Office*